(12) United States Patent
Yoshikawa

(10) Patent No.: US 8,031,755 B2
(45) Date of Patent: Oct. 4, 2011

(54) SURFACE EMITTING SEMICONDUCTOR LASER AND METHOD FOR FABRICATING THE SAME

(75) Inventor: Masahiro Yoshikawa, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/559,609

(22) Filed: Sep. 15, 2009

(65) Prior Publication Data
US 2010/0208760 A1 Aug. 19, 2010

(30) Foreign Application Priority Data
Feb. 13, 2009 (JP) .................. 2009-030596

(51) Int. Cl.
*H01S 5/183* (2006.01)
(52) U.S. Cl. ........... 372/50.124; 372/46.01; 372/46.013; 372/50.11; 372/87
(58) Field of Classification Search ........ 372/46.01, 372/46.13, 87, 50.124, 50.11
See application file for complete search history.

(56) References Cited

U.S. PATENT DOCUMENTS

| | | | |
|---|---|---|---|
| 6,317,446 B1 * | 11/2001 | Wipiejewski | 372/46.01 |
| 2005/0100068 A1 | 5/2005 | Jikutani et al. | |
| 2006/0007979 A1 * | 1/2006 | Jikutani et al. | 372/92 |
| 2008/0187015 A1 * | 8/2008 | Yoshikawa et al. | 372/45.01 |

FOREIGN PATENT DOCUMENTS

| | | |
|---|---|---|
| JP | 2000-12974 | 1/2000 |
| JP | 2004-253408 | 9/2004 |
| JP | 2005-277309 | 10/2005 |
| JP | 2005-354038 | 12/2005 |
| JP | 2008-283028 | 11/2008 |

OTHER PUBLICATIONS

Kent D. Choquette et al., *Advances in Selective Wet Oxidation of AlGaAs Alloys*, IEEE Journal of Selected Topics in Quantum Electronics, vol. 3, No. 3, Jun. 1997, pp. 916-926.

* cited by examiner

*Primary Examiner* — Jessica Stultz
*Assistant Examiner* — Michael Carter
(74) *Attorney, Agent, or Firm* — Fildes & Outland, P.C.

(57) ABSTRACT

A surface emitting semiconductor laser includes: a substrate; a first semiconductor multilayer reflection mirror of a first conduction type; an active region; a second semiconductor multilayer reflection mirror of a second conduction type; a first selectively oxidized layer that is formed in one of the first and second semiconductor multilayer reflection mirrors and includes a first oxidized region selectively oxidized, and a first conductive region surrounded by the first oxidized region; and a second selectively oxidized layer that is formed in one of the first and second semiconductor multilayer reflection mirrors and includes a second oxidized region selectively oxidized, and a second conductive region surrounded by the second oxidized region. A first semiconductor layer next to the first selectively oxidized layer has an Al composition greater than that of a second semiconductor layer next to the second selectively oxidized layer, the first conductive region having a size smaller than that of the second conductive region.

9 Claims, 17 Drawing Sheets

SURFACE EMITTING SEMICONDUCTOR LASER AND METHOD FOR FABRICATING THE SAME

CROSS-REFERENCE TO RELATED APPLICATION

This application is based on and claims priority under 35 USC 119 from Japanese Patent Application No. 2009-030596 filed Feb. 13, 2009.

BACKGROUND

1. Technical Field

The present invention relates to a surface emitting semiconductor laser, an optical semiconductor device, an optical transmission apparatus, an optical spatial transmission device, an optical transmission system, an optical spatial transmission system, and a method for fabricating a surface emitting semiconductor laser.

2. Related Art

A vertical cavity surface emitting laser (VCSEL) has a vertical resonator that is formed on a substrate and includes an active region. The vertical resonator amplifies laser emitted in a direction vertical to the substrate.

A VCSEL of a typical type has a current confining function for efficiently injecting current in the active region and a light confining function for efficiently confining light generated in the active region. A VCSEL of selective oxidation type having a mesa structure has a conductive region (oxidized aperture) surrounded by an oxidized region formed by selectively oxidizing a semiconductor layer having a high Al composition from the sidewall of the mesa. The conductive region is used for current confinement and light confinement.

SUMMARY

According to an aspect of the present invention, there is provided a surface emitting semiconductor laser includes: a substrate; a first semiconductor multilayer reflection mirror of a first conduction type that is formed on the substrate and includes pairs of semiconductor layers having different Al compositions; an active region formed on the first semiconductor multilayer reflection mirror; a second semiconductor multilayer reflection mirror of a second conduction type opposite to the first conduction type, the second semiconductor multilayer reflection mirror being formed on the active region and including pairs of semiconductor layers having different Al compositions; a first selectively oxidized layer that is formed in one of the first and second semiconductor multilayer reflection mirrors and includes a first oxidized region selectively oxidized, and a first conductive region surrounded by the first oxidized region, the first selectively oxidized layer including AlAs; and a second selectively oxidized layer that is formed in one of the first and second semiconductor multilayer reflection mirrors and includes a second oxidized region selectively oxidized, and a second conductive region surrounded by the second oxidized region, the second selectively oxidized layer including AlAs, a first semiconductor layer next to the first selectively oxidized layer having an Al composition greater than that of a second semiconductor layer next to the second selectively oxidized layer, and the first conductive region having a size smaller than that of the second conductive region.

DETAILED DESCRIPTION

A description will now be given of exemplary embodiments of the present invention with reference to the accompanying drawings.

Figure 1:
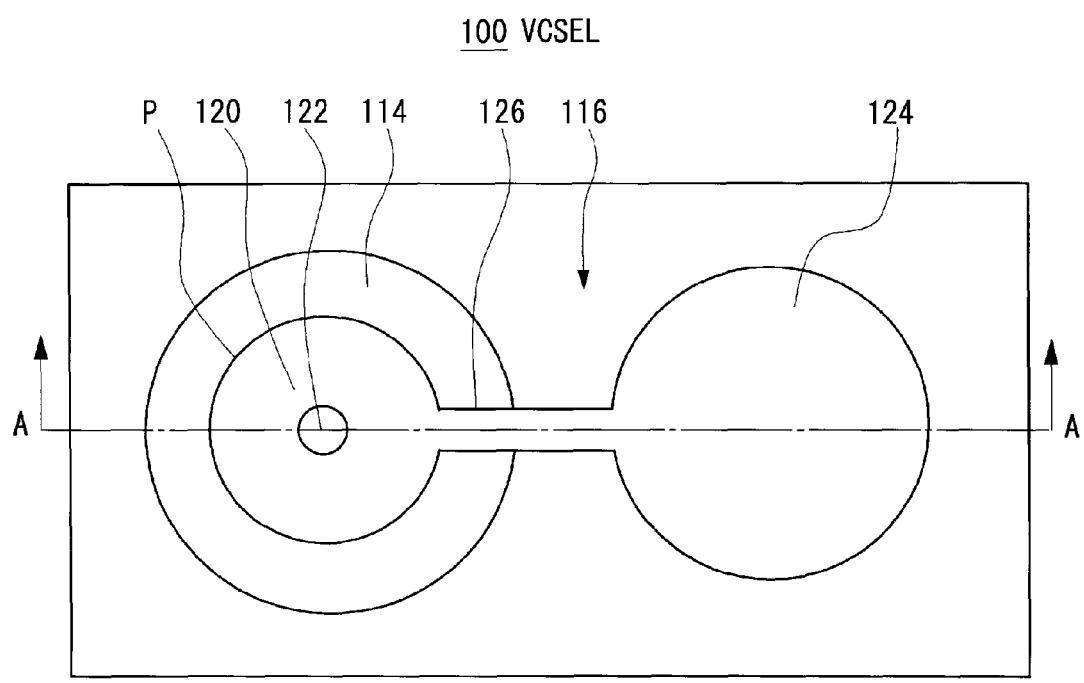
FIG. 1 is a plan view of a VCSEL in accordance with an exemplary embodiment of the present invention.
Figure 2:
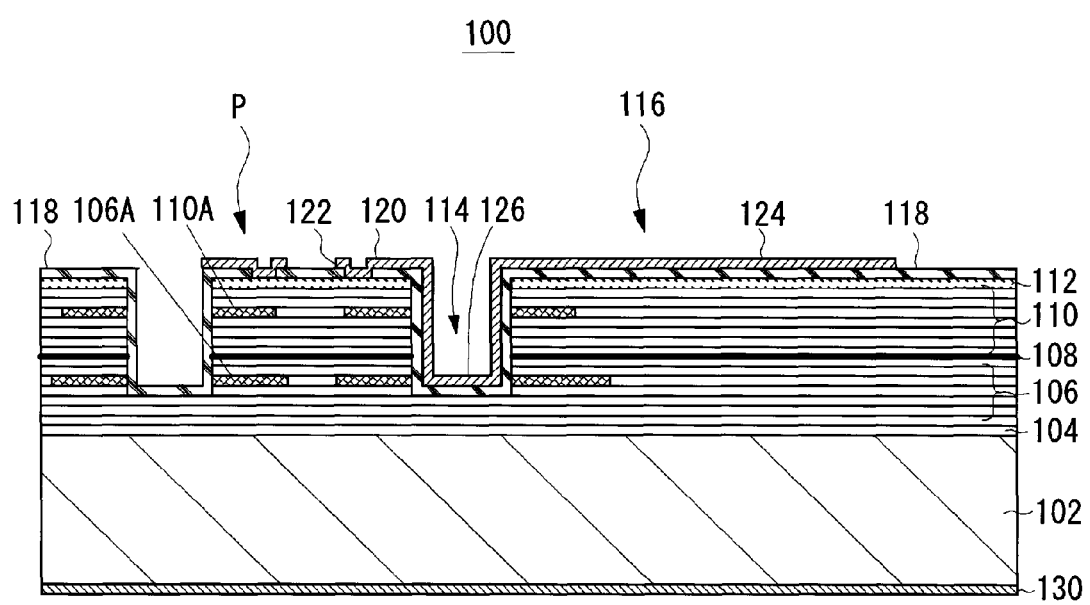
FIG. 2 is a cross-sectional view taken along a line A-A shown in FIG. 1.

FIG. 1 is a plan view of a VCSEL in accordance with an exemplary embodiment, and FIG. 2 is a cross-sectional view taken along a line A-A depicted in FIG. 1. The VCSEL includes an n-type GaAs substrate 102 having a back surface on which an n-side electrode 130 is provided. A multilayer structure is formed on a front surface of the n-type GaAs substrate 102. The multilayer structure includes an n-type GaAs buffer layer 104, an n-type lower DBR (Distributed Bragg Reflector) 106, an active region 108, a p-type upper DBR 110. The n-type lower DBR 106 is composed of pairs of AlGaAs semiconductor layers having different Al composition ratios. The p-type upper DBR 110 is composed of pairs of AlGaAs semiconductor layers having different Al composition ratios. A part of the lower DBR 106 is a first selectively oxidized layer 106A of n-type AlAs, and a part of the upper DBR 110 is a second selectively oxidized layer 110A of p-type AlAs. Each of the first and second selectively oxidized layers 106A and 110A is capable of functioning as a current confining layer and a light confining layer. The uppermost layer of the upper DBR 110 is a p-type GaAs contact layer 112.

A trench or groove 114 having a ring shape is formed on the GaAs substrate 102 so as to extend from the upper DBR 110 and reach a part of the lower DBR 106. The groove 114 may be formed by etching the semiconductor layers by the ordinary photolithographic process. The formation of the groove 114 defines a mesa or post P having a cylindrical shape. The mesa having an elliptic shape or a rectangular shape may be formed by changing the patterned shape of the groove 114. A post structure in the present specification may include varies shapes of posts or mesas.

The groove 114 is formed up to a depth that exposes at least the first selectively oxidized layer 106A. The groove 114 defines the post P, which is a light-emitting part, and also defines a pad forming region 116 separated from the post P. The post P includes a resonator structure that includes the lower DBR 106 and the upper DBR 110 that sandwich the active region 108. The first selectively oxidized layer 106A in the lower DBR 106 and the second selectively oxidized layer 110A in the upper DBR 110 are exposed to the side surface of the post P. The first and second oxidized layers 106A and 110A are defined by selectively oxidizing a predetermined distance of the post P from the side surface thereof in the selectively oxidizing process. The first and second oxidized layers 106A and 110A are respectively regions by selectively oxidizing the post P inwards from the side surface of the post P. The first and second oxidized layers 106A and 110A respectively define electrically conductive regions, which may be called first and second oxidized apertures.

The shapes of the first and second oxidized apertures substantially correspond to the outer shape of the post P. For example, when the post P is cylindrical, the first and second oxidized apertures have approximately circular shapes due to oxidation that goes inwards from the side surface of the post P. However, in a case where the oxidizing distance is relatively long, the shapes of the first and second oxidized apertures do not correspond to the outer shape of the post P due to anisotropy in the oxidation rate. The diameters of the first and second oxidized apertures may be adjusted by changing the oxidation rate of the first and second oxidized layers 106A and 110A. For example, the diameter or size of the first selectively oxidized layer 106A is selected so that the current confining function can be realized. The diameter or size of the second selectively oxidized layer 110A is selected so that the light confining function can be realized.

The positions of the first and second selectively oxidized layers 106A and 110A and the diameters of the respective oxidized apertures may be arbitrarily selected on the basis of the respective purposes. For example, in a case where the first selectively oxidized layer 106A is given a role of current confining, it is desirable that the first selectively oxidized layer 106A is closer to the active region and has a smaller diameter of the oxidized aperture. In this case, it is preferable that the first selectively oxidized layer 106A may be formed in the n-type DBR rather than the p-type DBR because a smaller resistance can be realized.

An interlayer insulation film 118 is formed on the whole substrate surface including the groove 114 and is then patterned. In patterning, a part of the interlayer insulation film 118 on the top of the post P is removed so as to define a ring-shaped contact hole. A p-side circular upper electrode 120 is formed on the top of the post P, and is electrically connected to a contact layer 112 via a contact hole formed in the interlayer insulation film 118. The upper electrode 120 may be made of gold or titanium/gold. An aperture 122 of a circular shape for defining the laser emission range is formed at the center of the upper electrode 120. In the example illustrated in FIG. 2, the aperture 122 is covered with the interlayer insulation film 118 in order to protect the contact layer 112 in such a manner that the contact layer 112 is not exposed. The aperture 122 may not be covered with the interlayer insulation film 118.

An electrode pad 124 having a circular shape is provided on the interlayer insulation film 118 in the pad forming region 116. The electrode pad 124 is connected to the p-side upper electrode 120 via an extraction electrode interconnection 126 extending over the groove 114.

Figure 3:
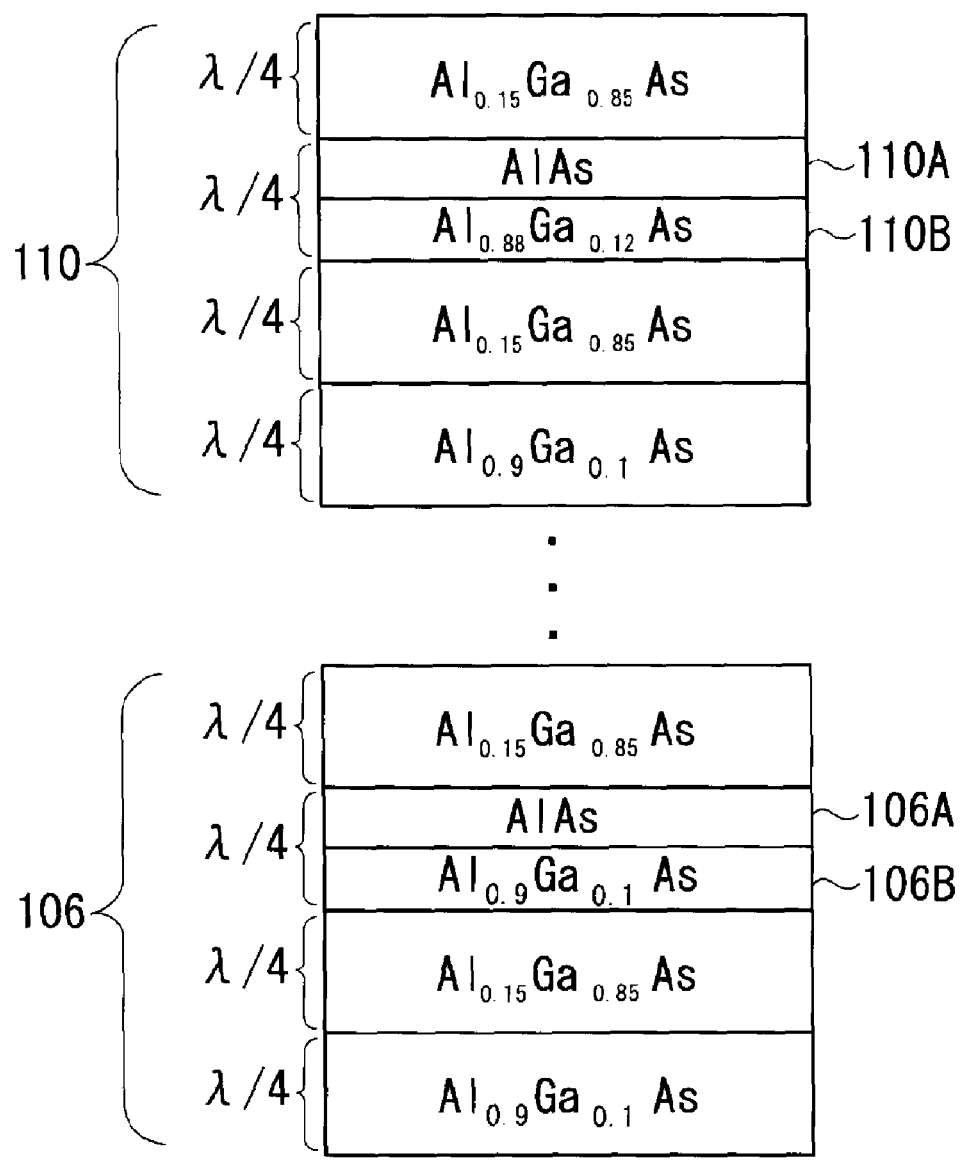
FIG. 3 illustrates a lower DBR and an upper DBR employed in the exemplary embodiment.

FIG. 3 depicts the details of a structure in the vicinity of the first and second selectively oxidized layers 106A and 110A illustrated in FIG. 2. The lower DBR 106 is composed of an $Al_{0.9}Ga_{0.1}As$ layer having a carrier concentration of $1\times10^{18}$ $cm^{-3}$ and an $Al_{0.15}Ga_{0.85}As$ layer having a carrier concentration of $1\times10^{18}$ $cm^{-3}$, which are alternately stacked by 40.5 periods (pairs). The thickness of each layer is equal to ¼ of the in-medium wavelength. The AlGaAs layer of one of the pairs of the lower DBR 106 which has a higher Al composition than the other AlGaAs layer is replaced by the first selectively oxidized layer 106A of n-type AlAs and a first oxidation rate adjustment layer 106B next to the first selectively oxidized layer 106A. In the example depicted in FIG. 3, the first oxidation rate adjustment layer 106B is formed of n-type $Al_{0.9}Ga_{0.1}As$, and the first selectively oxidized layer 106A is formed on the first oxidation rate adjustment layer 106B. The total thickness of the first selectively oxidized layer 106A and the first oxidation rate adjustment layer 106B is equal to $\lambda/4$ where $\lambda$ is the in-medium wavelength, and the first selectively oxidized layer 106A is about 20 nm thick.

The upper DBR 110 is composed of an Al0.9Ga0.1As layer having a carrier concentration of 1×1018 cm-3 and an Al0.15Ga0.85As layer having a carrier concentration of 1×1018 cm-3, which are alternately stacked by 30 periods (pairs). The thickness of each layer is equal to ¼ of the in-medium wavelength. The AlGaAs layer of one of the pairs of the upper DBR 110 which has a higher Al composition than the other AlGaAs layer is replaced by the second selectively oxidized layer 106A of p-type AlAs and a second oxidation rate adjustment layer 110B next to the second selectively oxidized layer 110A. In the example depicted in FIG. 3, the second oxidation rate adjustment layer 110B is formed of n-type $Al_{0.88}Ga_{0.12}As$, and the second selectively oxidized layer 110A is formed on the second oxidation rate adjustment layer 110B. The total thickness of the second selectively oxidized layer 110A and the second oxidation rate adjustment layer 110B is equal to $\lambda/4$ where $\lambda$ is the in-medium wavelength, and the second selectively oxidized layer 110A is about 20 nm thick. The first and second oxidation rate adjustment layers 106B and 110B are formed next to the lower sides of the first and second selectively oxidized layers 106A and 110A, respectively. Alternatively, the first and second oxidation rate adjustment layers 106B and 110B may be formed to the upper sides of the first and second selectively oxidized layers 106A and 110A, respectively.

Figure 4:
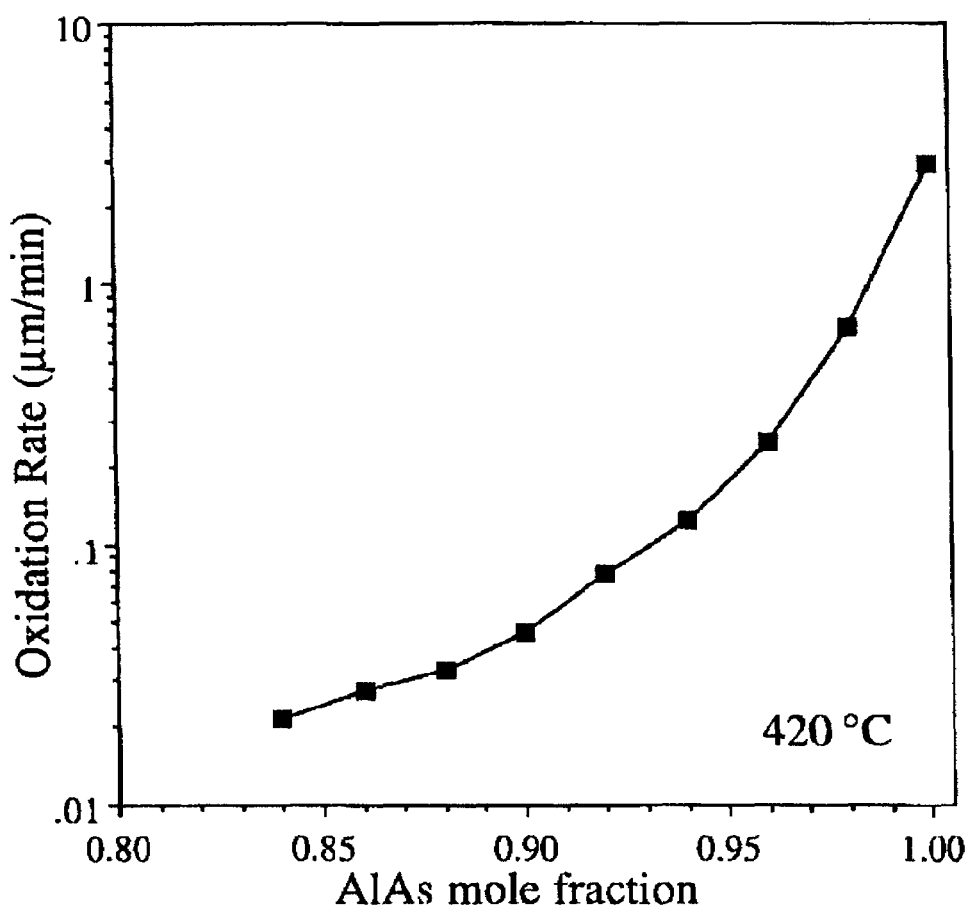
FIG. 4 is a graph of a relation between the Al composition and the oxidation rate.
Figure 5:
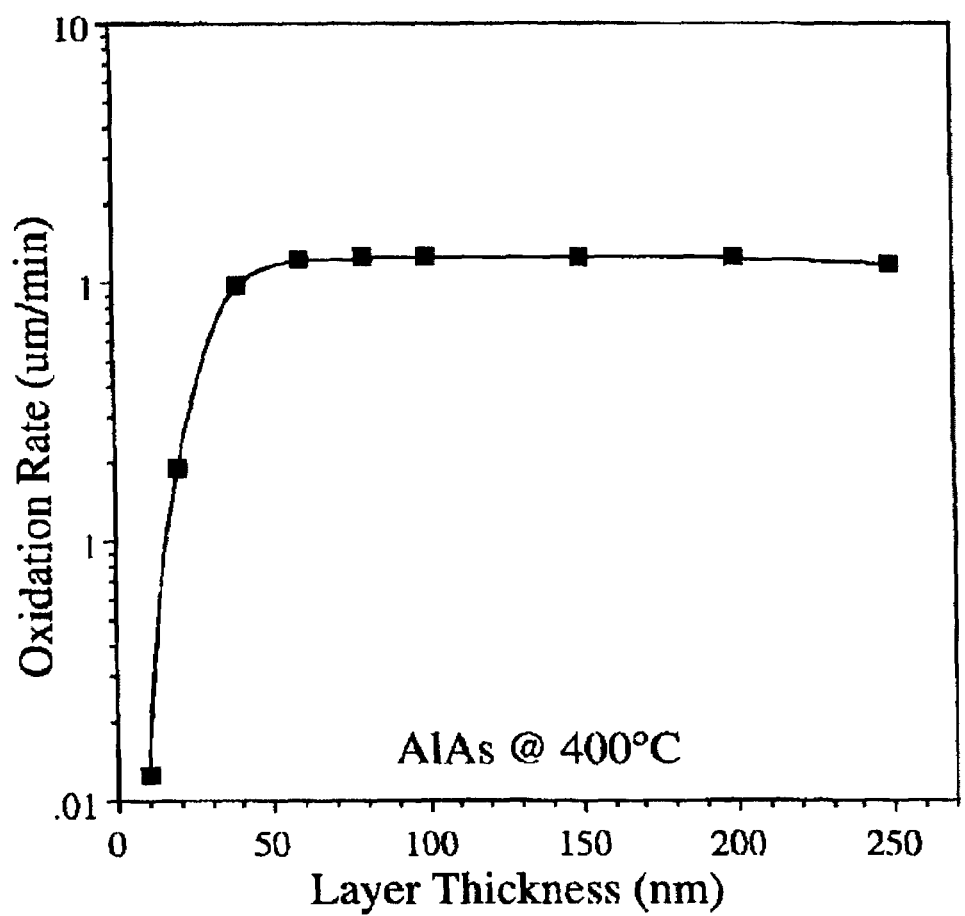
FIG. 5 is a graph of a relation between the oxidation rate and the layer thickness.

FIG. 4 is a graph of a relation between the oxidation rate (μm/min) and the AlAs mole fraction, and FIG. 5 is a graph of a relation between the oxidation rate (μm/min) and the layer thickness (nm). The graphs of FIGS. 4 and 5 are quoted from Kent D. Choquette et al., "Advances in Selective Wet Oxidation of AlGaAs Alloys", IEEE JOURNAL OF SELECTED TOPICS IN QUANTUM ELECTRONICS, Vol. 3, No. 3, June 1997, pp. 916-926.

In the VCSEL depicted in FIG. 2, the first and second selectively oxidized layers 106A and 110A are preferably designed to have a greater Al composition than that of the other AlGaAs layers that form the DBRs. If the Al composition is low, the oxidation rate is low and it takes a long time to complete desired oxidation. Thus, the oxidized distances of the first and second selectively oxidized layers 106A and 110A from the side surface of the post become greater than those of the other AlGaAs layers in the DBRs, and the first and second oxidized apertures are thus formed in the first and second selectively oxidized layers 106A and 110A, respectively.

In a case where the first and second oxidized apertures are designed to have almost the same size, the AlAs layers that form the first and second selectively oxidized layers 106A and 110A are designed to have an identical thickness and to be oxidized under the same oxidizing conditions. When the first selectively oxidized layer 106A is assigned the current confining function, it is desired that the first oxidized aperture has a small diameter. When the second selectively oxidized layer 110A is assigned the light confining function, the second oxidized aperture is not required to have a small diameter, but may be preferably designed to have a large diameter in order to reduce the electric resistance.

A way to relatively change the oxidized apertures of the first and second selectively oxidized layers subjected to simultaneous oxidation is to change the Al composition ratios of the first and second selectively oxidized layers. In this case, it is preferable that the Al composition ratios of the first and second selectively oxidized layers are greater than those of the other layers that form the DBRs. It is possible to make a difference in oxidation rate by setting the Al composition ratio of the first selectively oxidized layer equal to 1.00 and setting the Al composition ratio of the second selectively oxidized layer less than 1.00. With this setting, the diameters of the first and second oxidized apertures may be set different from each other.

The graph of FIG. 4 describes the oxidation rate (μm/min) of an AlGaAs layer that is oxidized at 420° C. within a range of the Al composition from 0.84 to 1.00, in which the vertical axis is on the logarithmic scale. The graph shows that the oxidation rate changes drastically for an Al composition ratio of about 0.95. The oxidation rate is about 3 μm min for an Al composition ratio of 1.00 (AlAs), and is reduced to about 0.33 μm/min for an Al composition ratio of 0.96. A slight change of the Al composition ratio changes the oxidation rate greatly. Each layer of the DBRs may be grown epitaxially by MOCVD. In actuality, there are slight differences in the Al composition among the layers. Adjustment of the oxidation rate by setting the Al composition of the second selectively oxidized layer smaller than 1.00 causes differences in the diameter of the oxidized aperture and encounters difficulty in reproducibility.

There is another way to adjust the diameter of the oxidized aperture. FIG. 5 is a graph of a relation between the oxidation rate of an AlAs layer that is oxidized at 400° C. in which the vertical axis is on the logarithmic scale. The oxidation rate is saturated and becomes constant when the thickness of the AlAs layer exceeds about 50 nm. For a layer thickness less than 50 nm, the oxidation rate changes from about 0.1 to 1.0 μm/min due to a slight change. It may be possible to make a difference in the layer thickness between the first and second selectively oxidized layers to change the oxidation rate of each layer. However, it is very difficult to adjust the oxidation rate by changing of the layer thickness because the first and second selectively oxidized layers are replaced by ones of the paired layers of the DBRs and are less than 50 nm thick for a certain oscillation frequency.

According to the present exemplary embodiment, the first and second selectively oxidized layers 106A and 110A are made of AlAs having an Al composition ratio of 1.00 and are equal in thickness to each other. It is easy to grow AlAs by MOCVD with little error and realize the equal thickness.

The present exemplary embodiment adjust the Al composition ratio so that the Al composition ratio of the first oxidation rate adjustment layer (AlGaAs) next to the first selectively oxidized layer 106A is different from that of the second oxidation rate adjustment layer (AlGaAs) of the upper DBR next to the second selectively oxidized layer 110A. In the example depicted in FIG. 3, the first oxidation rate adjustment layer 106B has an Al composition ratio of 0.90, and the second oxidation rate adjustment layer 110B has an Al composition ratio of 0.88.

Figure 6:
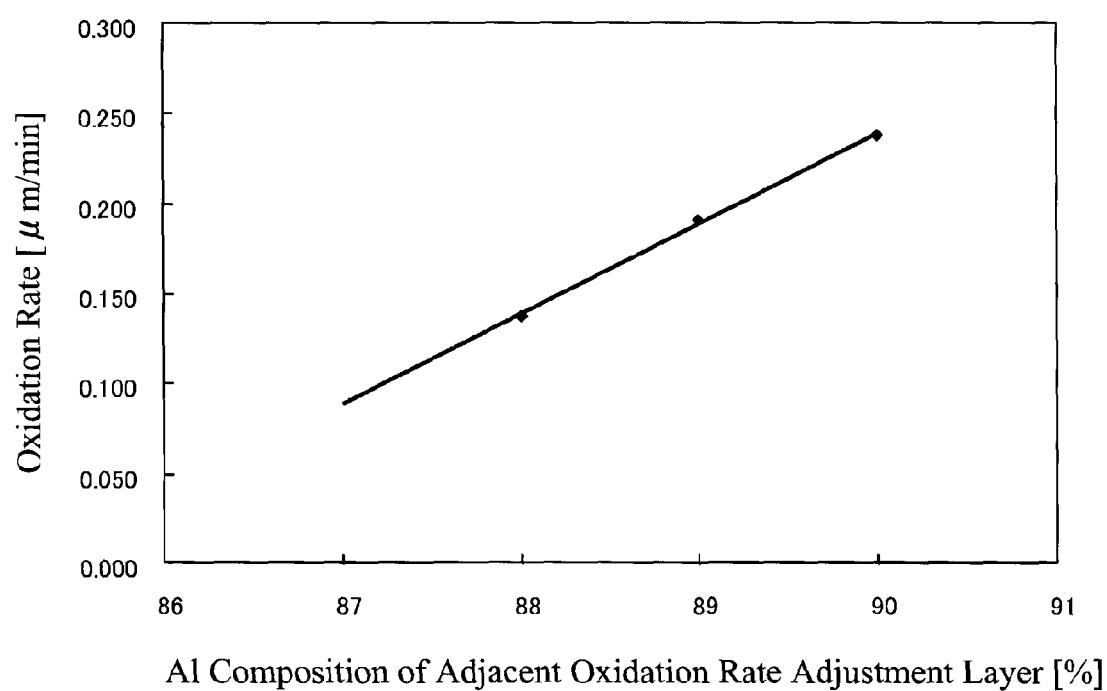
FIG. 6 is a graph of a relation between the oxidation rate and the Al composition of an adjacent oxidation rate adjustment layer.

When the Al composition of the oxidation rate adjustment layer next to AlAs is changed, the oxidation rate of AlAs is changed by the changed Al composition. FIG. 6 is a graph of a relation between the oxidation rate of AlAs and the Al composition of the oxidation rate adjustment layer next to AlAs. The oxidation rate illustrated in FIG. 6 is obtained when AlAs is 20 nm thick and the oxidizing temperature is 340° C. When the Al composition ratio of the oxidation rate adjustment layer is changed within the range of 0.87 to 0.90, the oxidation rate of AlAs is substantially proportional to the change of the Al composition ratio and is changed linearly. The change of the oxidation rate of AlAs is equivalent to changing the layer thickness of AlAs. By making a difference in the Al composition ratio between the first oxidation rate adjustment layer 106B and the second oxidation rate adjustment layer 110B, it is possible to adjust the oxidation rates of the first and second selectively oxidized layers 106A and 110A or the diameters of the oxidized apertures. It should be noted that the oxidation rate does not have a change as much as that in FIG. 4 due to a slight change of the Al composition. Thus, even when there is a slight difference in the Al composition by MOCVD, such a slight different does not affect the oxidation rate of AlAs greatly, so that the diameter of the oxidized aperture can be defined precisely. The thicknesses of the first and second selectively oxidized layers 106A and 110A are formed within a range in which the oxidation rate is not saturated, namely, less than 50 nm (see FIG. 5), and are preferably as thin as 20 nm.

Figure 7:
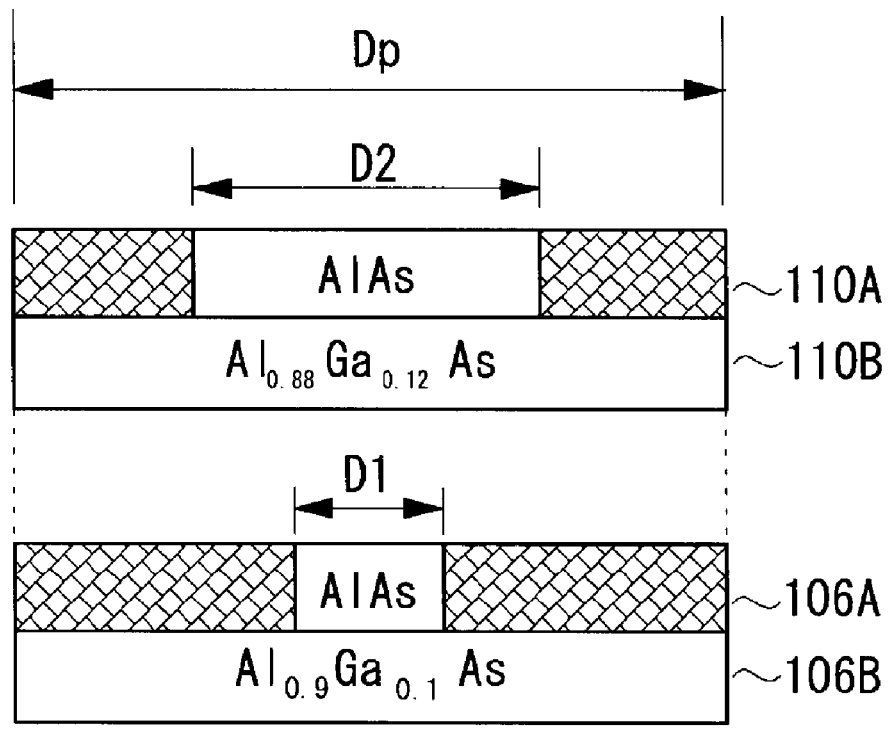
FIG. 7 depicts first and second oxidized apertures formed in first and second selectively oxidized layers.

FIG. 7 illustrates examples of the first and second oxidized apertures formed in the first and second selectively oxidized layers. A symbol Dp is the outer diameter of the post P and is 25 μm, for example. A symbol D1 is the diameter of the first oxidized aperture and is 3 μm, for example. A symbol D2 is the diameter of the second oxidized aperture and is 11 μm, for example. The Al composition of the first oxidation rate adjustment layer 106B is 0.90, and the Al composition of the second oxidation rate adjustment layer 110B is 0.88. Under the above conditions, the oxidation rate of the first selectively oxidized layer (AlAs) 106A is approximately 0.24 μm/min, and the oxidation rate of the second selectively oxidized layer (AlAs) 110A is approximately 0.13 μm/min. The oxidation distance that should be defined in the first selectively oxidized layer 106A is 11 μm, and the oxidation distance that should be defined in the selectively oxidized layer 110A is 7 μm. Thus, by setting the oxidation temperature equal to 340° C. and setting the oxidation time equal to 47 minutes, it is possible to realize the first and second oxidized aperture diameters D1 and D2 of 3 μm and 11 μm within the first and second selectively oxidized layers, respectively. The above is just an example, and desired aperture diameters may be realized by appropriately selecting the Al composition ratio of the oxidation rate adjustment layer, oxidation time and/or oxidation temperature.

Figure 8A:
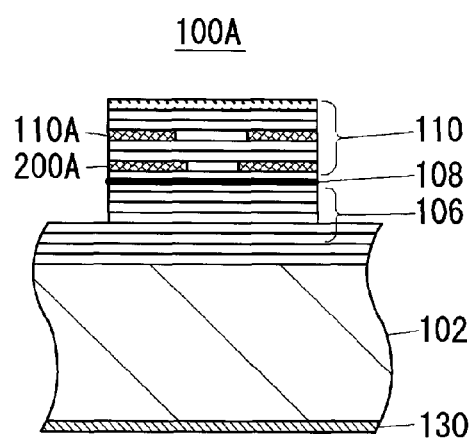
FIGS. 8A and 8B are cross-sectional views of variations of the embodiment.

A description will now be given of another example of VCSEL in accordance with the present invention. FIG. 8A is a cross-sectional view of a VCSEL 100A in which two selectively oxidized layers 110A and 200A are formed in the p-type upper DBR 110. The selectively oxidized layer 200A is made of p-type AlAs, and the Al composition of an oxidation rate adjustment layer next to the selectively oxidized layer 200A is set greater than the Al composition of an oxidation rate adjustment layer next to the selectively oxidized layer 110A. Thus, the diameter of the oxidized aperture formed in the selectively oxidized layer 200A is adjusted so as to be smaller than that of the oxidized aperture formed in the selectively oxidized layer 110A. Of course, it is possible to employ the relation between the diameters of the oxidized apertures that is opposite to the above.

Figure 8B:
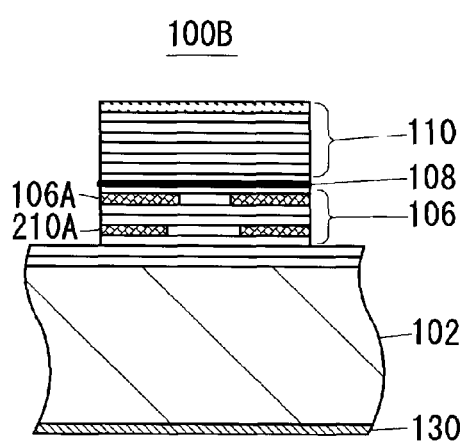

FIG. 8B depicts another structure in which two selectively oxidized layers 106A and 210A are formed within the n-type lower DBR 106. The selectively oxidized layer 210A is made of n-type AlAs. The Al composition of an oxidation rate adjustment layer next to the selectively oxidized layer 210A is set less than the Al composition of an oxidation rate adjustment layer next to the selectively oxidized layer 106A. Thus, the diameter of the oxidized aperture of the selectively oxidized layer 106A close to the active region 108 is adjusted so as to be smaller than that of the oxidized aperture of the selectively oxidized layer 210A.

In the above embodiment, the two selectively oxidized layers are formed within the resonator structure of the post. This structure may be varied so that three or more selectively oxidized layers are formed. The n-type GaAs substrate may be replaced by a p-type GaAs substrate. In this case, the lower DBR may be of p type and the upper DBR may be of n type. The n-side electrode provided on the backside of the substrate may be varied so as to be electrically connected to the n-type lower DBR in the bottom of the post on the substrate.

Figure 9A:
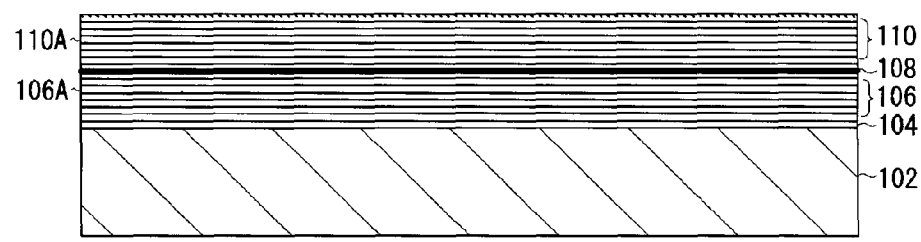
FIGS. 9A through 9C are cross-sectional views illustrating a method for fabricating the VCSEL of the embodiment.

A description will now be given of a method for fabricating the VCSEL in accordance with the present embodiment with reference to FIGS. 9A through 9C, 10A through 10C and 11A and 11B. Referring to FIG. 9A, the n-type GaAs buffer layer 104 having a thickness of about 0.2 μm and a carrier concentration of $1 \times 10^{18}$ cm$^{-3}$ is stacked on the n-type GaAs substrate 102 by MOCVD. The lower DBR 106 is formed on the n-type GaAs buffer layer 104 so that an $Al_{0.9}Ga_{0.1}As$ layer having a carrier concentration of $1 \times 10^{18}$ cm$^{-3}$ and an $Al_{0.15}Ga_{0.85}As$ layer having a carrier concentration of $1 \times 10^{18}$ cm$^{-3}$ are alternately stacked by 40.5 periods (pairs), in which the thickness of each layer is equal to ¼ of the in-medium wavelength. The active region 108 is formed on the lower DBR 106 so as to have an undoped lower $Al_{0.6}Ga_{0.4}As$ spacer layer, an undoped quantum well active layer, and an undoped $Al_{0.6}Ga_{0.4}As$ spacer layer. The thickness of the active region 108 is equal to the in-medium wavelength. The undoped quantum well active layer is composed of three GaAs quantum well layers having a thickness of 7 nm and four $Al_{0.3}Ga_{0.7}As$ barrier layers having a thickness of 8 nm. The upper DBR 110 is formed on the active region 108 so that an $Al_{0.9}Ga_{0.1}As$ layer having a carrier concentration of $1 \times 10^{18}$ cm$^{-3}$ and an $Al_{0.15}Ga_{0.85}As$ layer having a carrier concentration of $1 \times 10^{18}$ cm$^{-3}$ are alternately stacked by 30 periods (pairs), in which the thickness of each layer is equal to ¼ of the in-medium wavelength.

An AlAs layer having a thickness of about 20 nm for forming the first selectively oxidized layer 106A is provided in the lower DBR 106. In the DBR pair including the AlAs layer, the oxidation rate adjustment layer 106B having a high Al composition is provided next to AlAs so as to have ¼ of the in-medium wavelength. As depicted in FIG. 3, the AlGaAs layer of the oxidation rate adjustment layer 106B is designed to have an Al composition of 90%. An AlAs layer having a thickness of about 20 nm for forming the second selectively oxidized layer 110A is provided in the upper DBR 110. In the DBR pair including the AlAs layer, the second oxidation rate adjustment layer 110B having a high Al composition so as to have ¼ of the in-medium wavelength is provided next to AlAs. The Al composition of AlGaAs of the second oxidation rate adjustment layer is 88%. Although not illustrated, a p-type GaAs contact layer may be stacked on the uppermost layer so as to have a carrier concentration of $1 \times 10^{19}$ cm$^{-3}$ and a thickness of 20 nm.

In order to reduce the electric resistance of the DBR, a particular region having a thickness of 20 nm may be provided at an interface between $Al_{0.9}Ga_{0.1}As$ and $Al_{0.15}Ga_{0.85}As$, in which the particular region has an Al composition that gradually changes from 90% to 15%. Source gas may be trimethyl gallium, trimethyl aluminum or arsine, and the dopant may be cyclopentadienylmagnesium for the p type and arsine for the n type. The substrate temperature may be set at 750° C. during growth. The source gas may be changed to continuously grow the film without destroying vacuum.

Figure 9B:
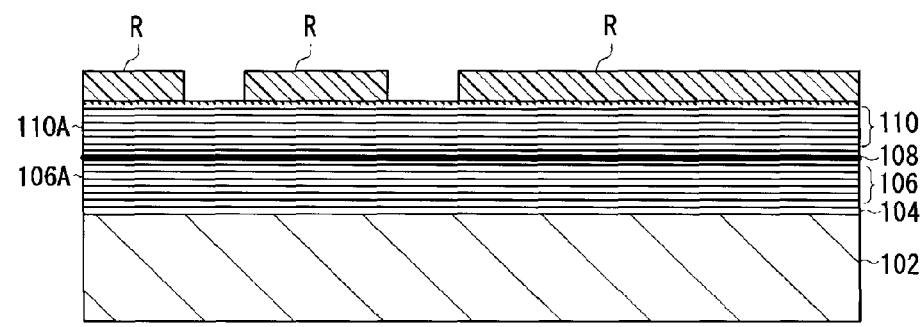
Figure 9C:
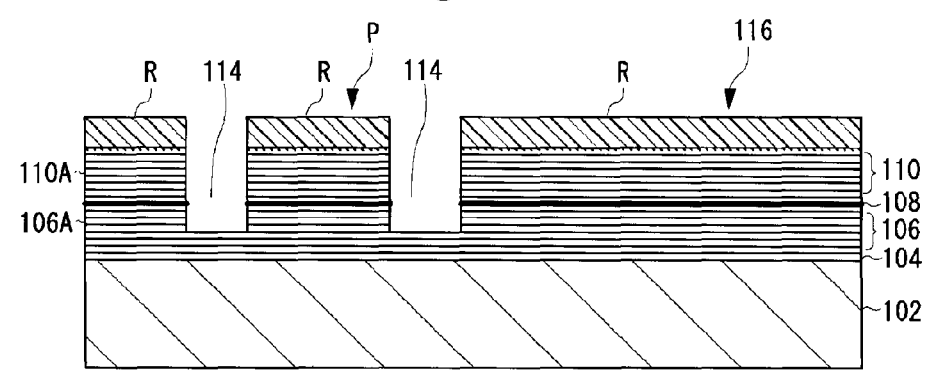

As illustrated in FIGS. 9B and 9C, a resist mask R is photolithographically formed on the top of the stacked layer structure, which is then etched by reactive ion etching with an etching gas of boron trichloride until the first selectively oxidized layer 106A in the lower DBR 106 is exposed. Thus, the ring-shaped groove 114 is formed on the substrate, and the post P and the pad forming region 116 can be formed. The post P may have a circular shape, an elliptic shape or a rectangular shape.

The resist R is removed, and the substrate is exposed to a moisture atmosphere at 340° C. for a predetermined time to thus oxidize the multilayer structure. The oxidation rates of the first and second selectively oxidized layers 106A and 110A are very higher than those of the $Al_{0.9}Ga_{0.1}As$ layers and the $Al_{0.15}Ga_{0.85}As$ layers that form the DBRs. The oxidized regions 106C and 110C having shapes corresponding to the shape of the post P are formed from the side surface of the post P, and the remaining conductive regions that are not oxidized are the first and second oxidized apertures. As has been described previously, the Al composition ratio of the first oxidation rate adjustment layer 106B next to the first selectively oxidized layer 106A is relatively high. Thus, the oxidation distance of the first selectively oxidized layer 106A is greater than that of the second selectively oxidized layer 110A. In other words, the first selectively oxidized layer 106A is oxidized faster than the second selectively oxidized layer 110A. As a result, the diameter of the first oxidized aperture of the first selectively oxidized layer 106A is smaller than that of the second oxidized aperture of the second selectively oxidized layer 110A.

Figure 10A:
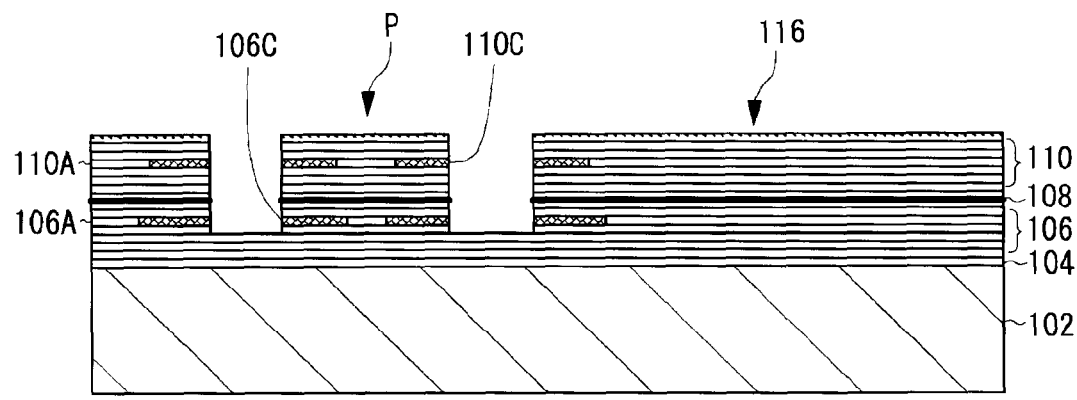
FIGS. 10A through 10C are cross-sectional views illustrating subsequent steps of the method for fabricating the VCSEL of the embodiment.
Figure 10B:
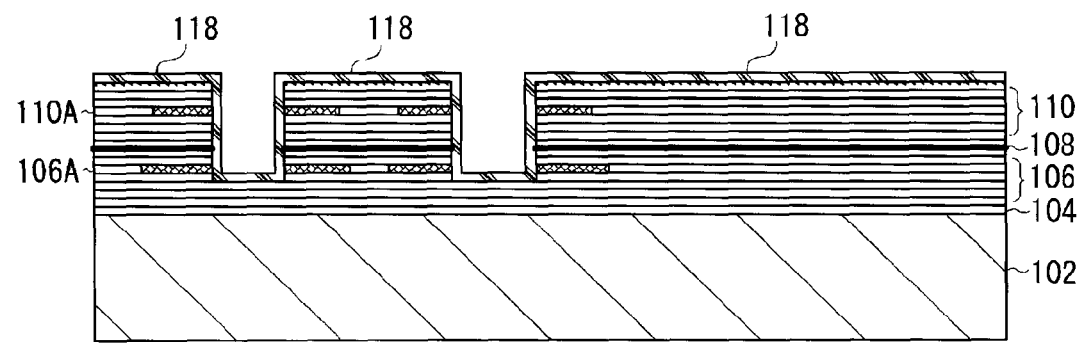
Figure 10C:
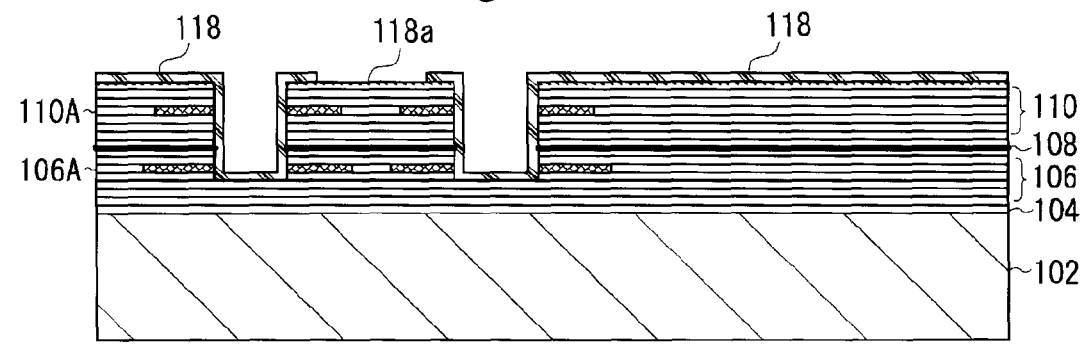

Then, as depicted in FIG. 10B, the interlayer insulation film 118 made of, for example, SiN, is evaporated on the whole substrate surface including the groove 114 by a plasma CVD apparatus. Thereafter, as illustrated in FIG. 10C, the SiN film on the top of the post P is removed by the ordinary photolithographic process and the etching process with buffered hydrofluoric acid to thus form a contact hole 118a shaped into a circular. The contact hole 118a may be varied so as to have a ring shape in which the contact layer of the upper DBR that is the emission region is protected with SiN.

Figure 11A:
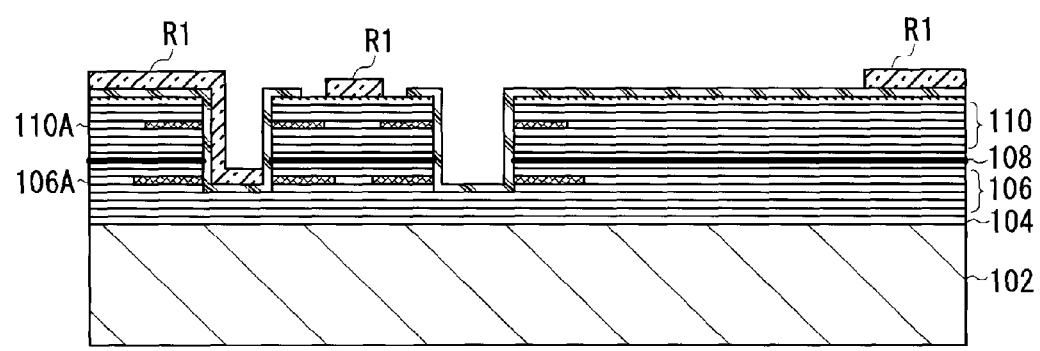
FIGS. 11A and 11B are cross-sectional views illustrating further subsequent steps of the method for fabricating the VCSEL of the embodiment.
Figure 11B:
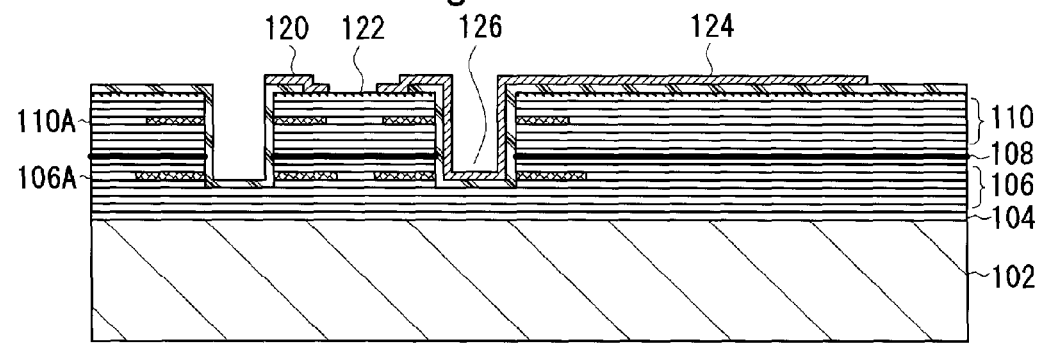

Then, as depicted in FIG. 11A, a resist pattern R1 is formed at the center on the top of the post P by the photolithographic process, and a p-side electrode material of Au is deposited to 100-1000 nm, preferably, 600 nm by an EB evaporation machine. After that, the resist pattern R1 is removed. At that time, Au on the resist pattern R1 is removed, and the upper electrode 120, the electrode pad 124 and the extraction electrode interconnection 126 are fabricated, as illustrated in FIG. 11B. The laser beam is emitted from a portion that does not have the p-side electrode, that is, the aperture 122 located at the center of the post P. Preferably, the aperture 122 has a diameter of 3-20 µm.

Then, Au/Ge for the n-side electrode is evaporated on the back surface of the substrate. After that, the substrate is annealed at a temperature of 250° C.-500° C., preferably, 300° C.-400° C. for ten minutes. The annealing time is not limited to 10 minutes but may be in the range of 0-30 minutes. The evaporation method is not limited to the EB evaporation machine but may be implemented by resistance heating, sputtering, magnetron sputtering, or CVD. The annealing process is not limited to the ordinary electric heating furnace but may be implemented by flash anneal using infrared ray, laser anneal, RF heating, anneal using electron beams, or anneal using a lump. Similar effects may be obtained by any of the above annealing methods.

Figure 12A:
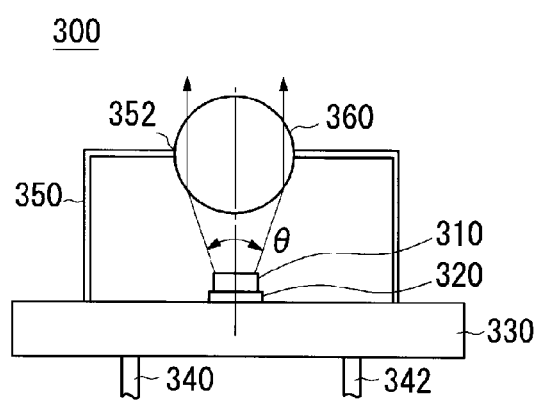
FIG. 12A is a cross-sectional view of an optical semiconductor device having the VCSEL of the embodiment.

A description will now be given of a surface emitting laser device, an optical information processing device, and an optical transmission device configured by using the VCSEL of the embodiments. FIG. 12A is a cross-sectional view a surface emitting laser device in which the VCSEL and an optical component is packaged. A surface emitting semiconductor laser device 300 is has a chip 310 on which the VCSEL is formed is fixed to a disk-shaped metal stem 330 by an electrically conductive adhesive 320. Electrically conductive leads 340 and 342 are inserted into through holes (not illustrated) formed in the stem 330. The lead 340 is electrically connected to the n-side electrode of the VCSEL, and the other lead 342 is electrically connected to the p-side electrode.

A rectangular hollow cap 350 is fixed on the stem 330 including the chip 310, and a ball lens 360 is fixed in a window 352 provided at the center of the cap 350. The optical axis of the ball lens 360 is positioned so as to coincide with the center of the chip 310. When a forward voltage is applied between the leads 340 and 342, the laser beam is emitted vertically from the chip 310. The distance between the chip 310 and the ball lens 360 is adjusted so that the ball lens 360 is included within the beam divergence angle θ of the laser beam emitted from the chip 310. A light receiving element and a temperature sensor may be arranged in the cap 350 in order to monitor the emitting condition of the VCSEL.

Figure 12B:
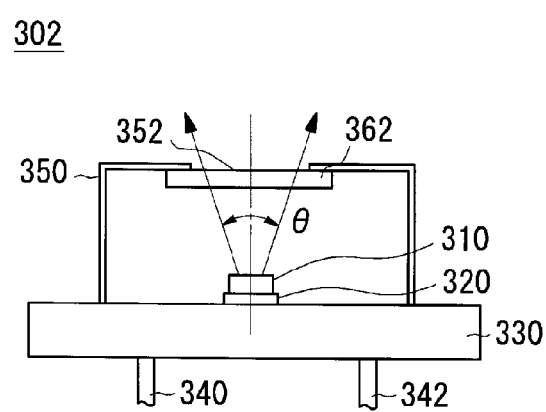
FIG. 12B is a cross-sectional view of another optical semiconductor device having the VCSEL of the embodiment.

FIG. 12B illustrates another configuration of the surface emitting semiconductor laser device 302, which uses a flat glass plate 362 instead of the ball lens 360 so as to cover the window 352. The center of the flat glass plate 362 is positioned so as to coincide with the center of the chip 310. The distance between the chip 310 and the flat glass plate 362 is adjusted so that the window 352 is included within the beam divergence angle θ of the laser beam emitted from the chip 310.

Figure 13:
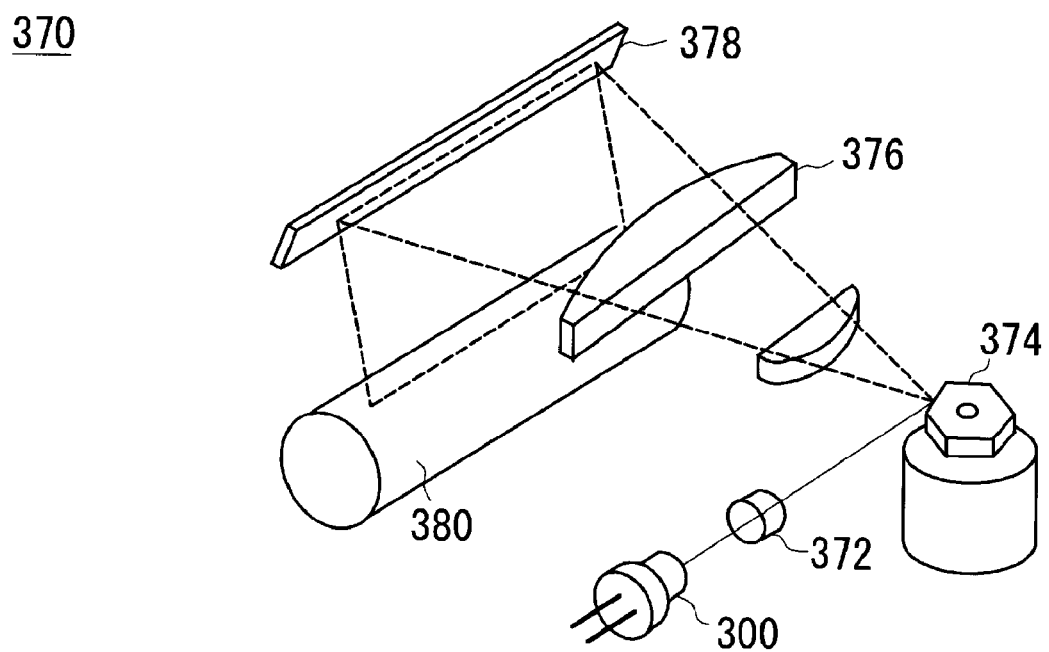
FIG. 13 is a perspective view of a light source using the VCSEL of the embodiment.

FIG. 13 illustrates an example in which the VCSEL is used as a light source of an optical information processing device. An optical information processing device 370 includes the semiconductor laser device 300 or 302, a collimator lens 372, a polygon mirror 374, an fθ lens 376, a line-shaped reflection mirror 378, and a photosensitive drum (recording medium) 380. The laser beam from the semiconductor laser device 300 or 302 is incident to the collimator lens 372. The polygon mirror 374 rotates at a constant velocity, and reflects the laser beam from the collimator lens 372 at a constant beam divergence angle. The fθ lens 376 receives the laser beam from the polygon mirror 374 and projects the reflection mirror 378. A latent image is formed on the photosensitive drum 380 by the reflected laser beam from the reflection mirror 378. The VCSEL of the embodiments may be used as a light source of an optical information processing device such as a copying machine or a printing machine having an optical system for focusing the laser beam from the VCSEL on the photosensitive drum, and a scanning system for scanning the laser beam on the photosensitive drum.

Figure 14:
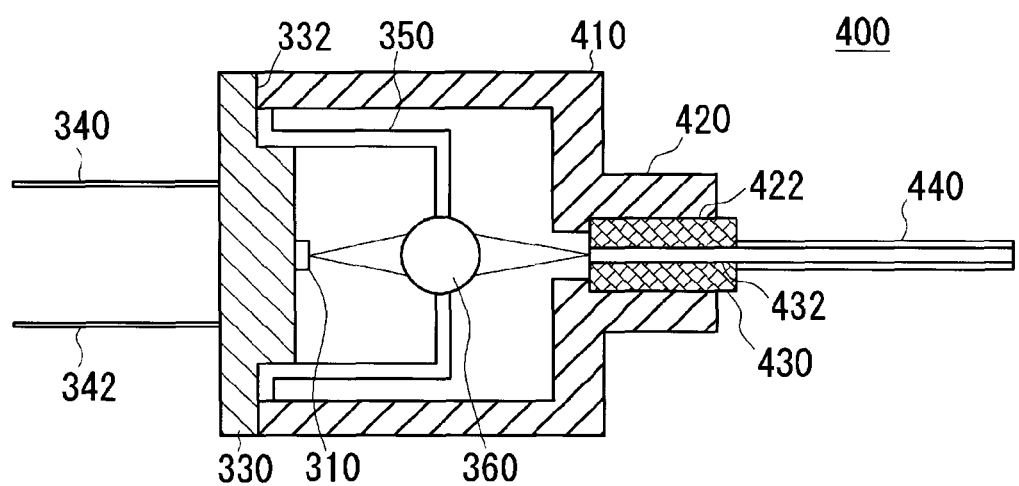
FIG. 14 is a cross-sectional view of an optical transmission apparatus using the optical semiconductor device illustrated in FIG. 12A or 12B.

FIG. 14 is a cross-sectional view an optical transmission device to which the surface emitting semiconductor laser illustrated in FIG. 12A is applied. An optical transmission device 400 includes a housing 410, a sleeve 420, a ferule 430, and an optical fiber 440. The housing 410 is formed into a hollow cylindrical shape and is fixed to the stem 330. The sleeve 420 is integrally formed to an end surface of the housing 410. The ferule 430 is held in an opening 422 of the sleeve 420. The optical fiber 440 is held by the ferule 430. An end of the housing 410 is fixed to a flange 332 formed in the circumferential direction of the stem 330. The ferule 430 is precisely positioned in the opening 422 of the sleeve 420, and the optical axis of the optical fiber 440 is aligned with the optical axis of the ball lens 360. A core line of the optical fiber 440 is held in a through hole 432 of the ferule 430.

The laser beam emitted from the surface of the chip 310 is collected by the ball lens 360, and is incident to the core line of the optical fiber 440. The ball lens 360 may be replaced with another lens such as a double-convex lens or a plane-convex lens. The optical transmission device 400 may include a driving circuit for applying the electric signal to the leads 340 and 342. The optical transmission device 400 may include a function of receiving the light signal via the optical fiber.

Figure 15:
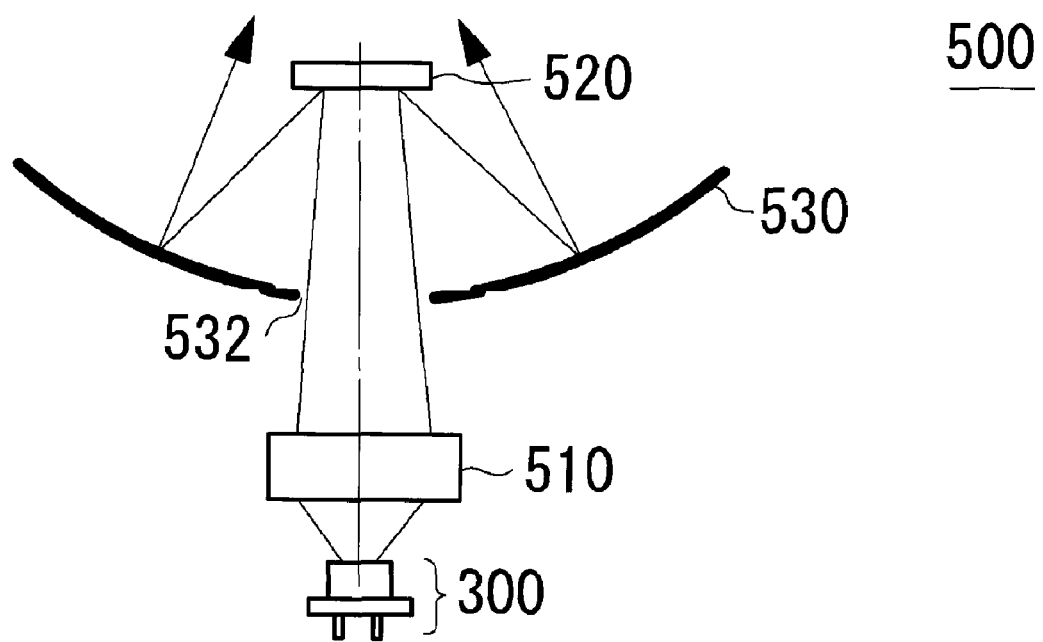
FIG. 15 illustrates a structure in which the optical semiconductor device illustrated in FIG. 12A or 12B is applied to a spatial transmission system.

FIG. 15 depicts an exemplary structure in which the optical semiconductor device depicted in FIG. 12A or 12B is applied to a spatial transmission system. A spatial transmission system 500 includes a package of the laser device 300 or 302, a condenser lens 510, a divergence plate 520, and a reflection mirror 530. The light condensed by the condenser lens 510 passes through an aperture 532 of the reflection mirror 530 and is reflected by the divergence plate 520. The reflected light is reflected by the reflection mirror 530 and travels in a predetermined direction for optical transmission.

Figure 16A:
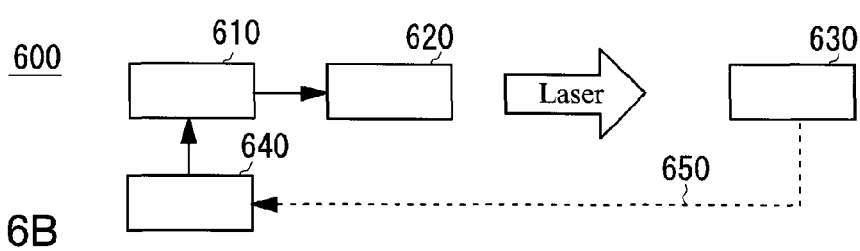
FIG. 16A is a block diagram of an optical transmission system.

FIG. 16A illustrates an exemplary structure of an optical transmission system in which the aforementioned VCSEL is sued as a light source. An optical transmission system 600 is composed of a light source 610 including the chip 310 on which the VCSEL is formed, an optical system 620, a light receiving system 630 and a controller 640. The optical system 620 condenses light emitted from the light source 610. The light receiving system 630 receives the laser beam from the optical system 620. The controller 640 controls the drive of the light source 610. The controller 640 supplies a drive pulse signal for driving the VCSEL to the light source 610. The laser beam emitted from the light source 610 passes through the optical system 620 and is transmitted to the light receiving system 630 via an optical fiber and a reflection mirror for spatial transmission. The light receiving system 630 detects the received light by a photodetector. The light receiving system 630 may be configured so as to control the controller 640 by a control signal 650. For example, the start timing for optical transmission may be controlled by the control signal 650.

Figure 16B:
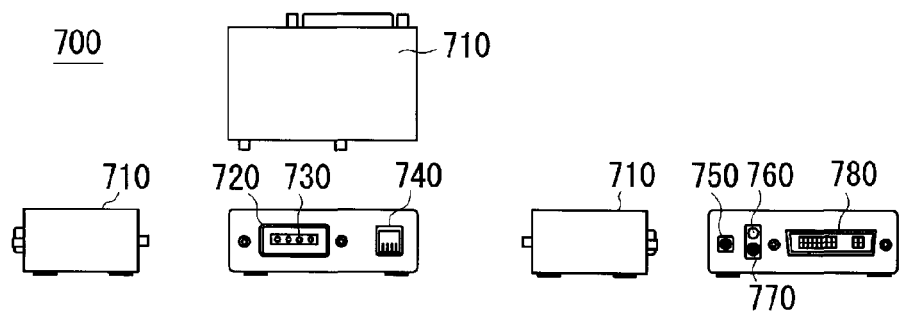
FIG. 16B illustrates an outer appearance of an optical transmission apparatus.

FIG. 16B illustrates an exemplary structure of an optical transmission apparatus utilized for optical transmission systems. An optical transmission apparatus 700 includes a housing 710, a light signal transmission/reception connector joining part 720, a light emitting/receiving element 730, an electric signal cable joining part 740, a power supply input part 750, an LED 760 that indicates in-operation, and an LED 770 that indicates the occurrence of a fault, and a DVI connector 780. The optical transmission apparatus 700 includes a transmission circuit board and a reception circuit board in the housing 710.

Figure 17:
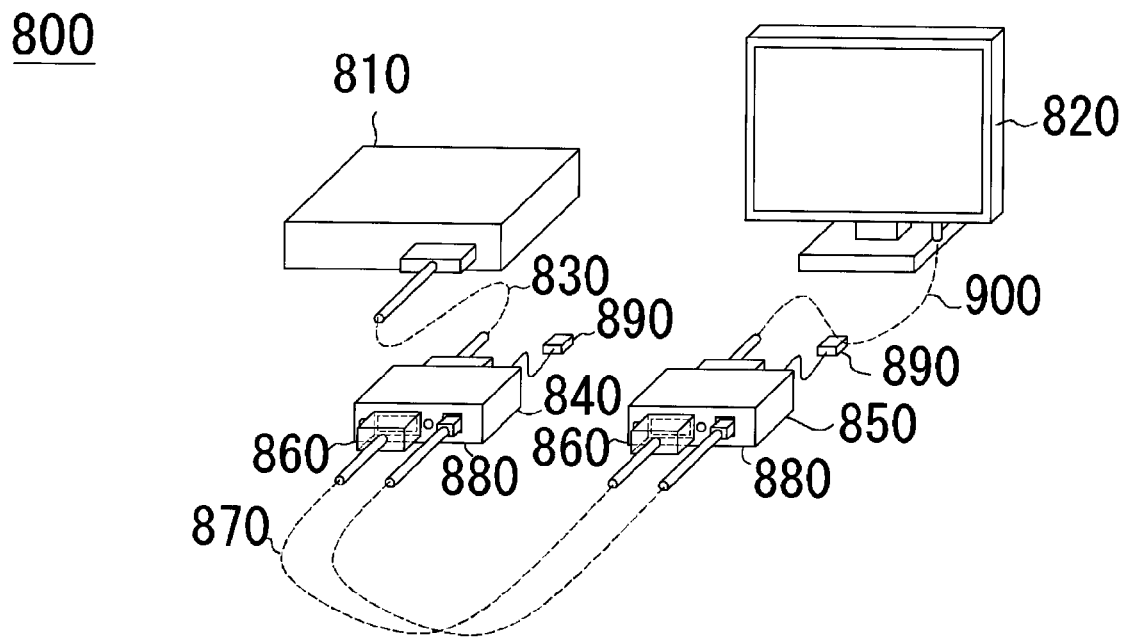
FIG. 17 is a diagram of an image transmission system utilizing the optical transmission apparatus illustrated in FIG. 16B.

FIG. 17 illustrates an exemplary image transmission system using the optical transmission apparatus 700. An image transmission system 800 utilizes the optical transmission apparatus 700 illustrated in FIG. 16B in order to transmit a image signal generated by an image signal generating apparatus 810 to an image display unit 820. That is, the image transmission system 800 includes the image signal generating apparatus 810, the image display unit 820, a DVI electric cable 830, an optical semiconductor device 840 for transmission, an optical semiconductor device 850 for reception, a DVI electric cable connector 860, an optical fiber 870, a control signal electric cable connector 880, a power supply adapter 890, and a DVI electric cable 900.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface emitting semiconductor laser comprising:
   a substrate;
   a first semiconductor multilayer reflection mirror of a first conduction type that is formed on the substrate and includes pairs of semiconductor layers having different Al compositions;
   an active region formed on the first semiconductor multilayer reflection mirror;
   a second semiconductor multilayer reflection mirror of a second conduction type opposite to the first conduction type, the second semiconductor multilayer reflection mirror being formed on the active region and including pairs of semiconductor layers having different Al compositions;
   a first selectively oxidized layer that is formed in one of the first and second semiconductor multilayer reflection mirrors and includes a first oxidized region selectively oxidized, and a first conductive region surrounded by the first oxidized region, the first selectively oxidized layer including AlAs; and
   a second selectively oxidized layer that is formed in one of the first and second semiconductor multilayer reflection mirrors and includes a second oxidized region selectively oxidized, and a second conductive region surrounded by the second oxidized region, the second selectively oxidized layer including AlAs,
   a first semiconductor layer next to the first selectively oxidized layer having an Al composition greater than that of a second, semiconductor layer next to the second selectively oxidized layer, and
   the first conductive region having a size smaller than that of the second conductive region,
   wherein a total thickness of the first selectively oxidized layer and the first semiconductor layer is equal to $\lambda/4n$ where $\lambda$ is an oscillation wavelength, and n is a refractive index of a medium, and a total thickness of the second selectively oxidized layer and the second semiconductor layer is equal to $\lambda/4n$, and the first selectively oxidized layer and the second selectively oxidized layer have an identical thickness, which is equal to or less than 50 nm.

2. The surface emitting semiconductor laser according to claim 1, wherein a post is formed on the substrate, and the first and second oxidized regions of the first and second selectively oxidized layers are defined by an identical oxidation process from a side surface of the post.

3. The surface emitting semiconductor laser according to claim 1, wherein the first selectively oxidized layer is closer to the active region than the second selectively oxidized layer.

4. The surface emitting semiconductor laser according to claim 1, wherein:
   the first semiconductor multilayer reflection mirror is of n type;
   the second semiconductor multilayer reflection mirror is of p type;
   the first selectively oxidized layer is formed in the first semiconductor multilayer reflection mirror; and
   the second selectively oxidized layer is formed in the second semiconductor multilayer reflection mirror.

5. A method for fabricating a surface emitting semiconductor laser comprising:
   forming a first semiconductor multilayer reflection mirror of a first conduction type that is formed on a substrate and includes pairs of semiconductor layers having different Al compositions;
   forming an active region formed on the first semiconductor multilayer reflection mirror;
   forming a second semiconductor multilayer reflection mirror of a second conduction type opposite to the first conduction type, the second semiconductor multilayer reflection mirror being formed on the active region and including pairs of semiconductor layers having different Al compositions;
   forming a first selectively oxidized layer that is formed in one of the first and second semiconductor multilayer reflection mirrors and includes a first oxidized region selectively oxidized, and a first conductive region surrounded by the first oxidized region, the first selectively oxidized layer including AlAs; and
   forming a second selectively oxidized layer that is formed in one of the first and second semiconductor multilayer reflection mirrors and includes a second oxidized region selectively oxidized, and a second conductive region surrounded by the second oxidized region, the second selectively oxidized layer including AlAs,
   a first semiconductor layer next to the first selectively oxidized layer having an Al composition greater than that of a second, semiconductor layer next to the second selectively oxidized layer, and
   the first conductive region having a size smaller than that of the second conductive region,
   wherein a total thickness of the first selectively oxidized layer and the first semiconductor layer is equal to $\lambda/4n$ where $\lambda$ is an oscillation wavelength, and n is a refractive index of a medium, and a total thickness of the second selectively oxidized layer and the second semiconductor layer is equal to $\lambda/4n$, and the first selectively oxidized layer and the second selectively oxidized layer have an identical thickness, which is equal to or less than 50 nm.

6. An optical semiconductor device comprising;
a surface emitting semiconductor laser; and
an optical system coupled with the surface emitting semiconductor laser,
the surface emitting semiconductor laser including:
a substrate;
a first semiconductor multilayer reflection mirror of a first conduction type that is formed on the substrate and includes pairs of semiconductor layers having different Al compositions;
an active region formed on the first semiconductor multilayer reflection mirror;
a second semiconductor multilayer reflection mirror of a second conduction type opposite to the first conduction type, the second semiconductor multilayer reflection mirror being formed on the active region and including pairs of semiconductor layers having different Al compositions;
a first selectively oxidized layer that is formed in one of the first and second semiconductor multilayer reflection mirrors and includes a first oxidized region selectively oxidized, and a first conductive region surrounded by the first oxidized region, the first selectively oxidized layer including AlAs; and
a second selectively oxidized layer that is formed in one of the first and second semiconductor multilayer reflection mirrors and includes a second oxidized region selectively oxidized, and a second conductive region surrounded by the second oxidized region, the second selectively oxidized layer including AlAs,
a first semiconductor layer next to the first selectively oxidized layer having an Al composition greater than that of a second semiconductor layer next to the second selectively oxidized layer, and
the first conductive region having a size smaller than that of the second conductive region,
wherein a total thickness of the first selectively oxidized layer and the first semiconductor layer is equal to $\lambda/4n$ where is an oscillation wavelength, and n is a refractive index of a medium, and a total thickness of the second selectively oxidized layer and the second semiconductor layer is equal to $\lambda/4n$, and the first selectively oxidized layer and the second selectively oxidized layer have an identical thickness, which is equal to or less than 50 nm.

7. The surface emitting semiconductor laser according to claim 1, wherein the identical thickness is about 20 nm.

8. The method of claim 5, wherein the identical thickness is about 20 nm.

9. The optical semiconductor device of claim 6, wherein the identical thickness is about 20 nm.